United States Patent
Kwon

[19]

[11] Patent Number: 6,093,957
[45] Date of Patent: Jul. 25, 2000

[54] MULTILAYER LEAD FRAME STRUCTURE THAT REDUCES CROSS-TALK AND SEMICONDUCTOR PACKAGE USING SAME AND FABRICATION METHOD THEREOF

[75] Inventor: Oh-Kyong Kwon, Seoul, Rep. of Korea

[73] Assignee: LG Semicon Co., Ltd., Cheongju, Rep. of Korea

[21] Appl. No.: 09/059,565

[22] Filed: Apr. 14, 1998

[30] Foreign Application Priority Data

Apr. 18, 1997 [KR] Rep. of Korea ....................... 97-14415

[51] Int. Cl.[7] ........................... H01L 23/52; H01L 23/48; H01L 23/495; H05K 7/20
[52] U.S. Cl. .......................... 257/666; 257/728; 257/528; 257/532; 257/531; 257/700; 257/691; 257/676; 257/698; 257/787; 257/692; 174/52.2; 174/52.4
[58] Field of Search ..................................... 257/666, 700, 257/668, 701, 676, 690, 691, 728, 696, 698, 692, 693, 758, 536, 528, 531, 532, 787; 361/745, 782; 174/52.5, 52.4

[56] References Cited

U.S. PATENT DOCUMENTS

| | | | |
|---|---|---|---|
| 5,089,878 | 2/1992 | Lee ........................................... | 257/664 |
| 5,108,553 | 4/1992 | Foster et al. ............................. | 205/125 |
| 5,159,750 | 11/1992 | Dutta et al. ................................ | 29/827 |
| 5,291,060 | 3/1994 | Shimizu et al. ......................... | 257/667 |
| 5,498,901 | 3/1996 | Chillara et al. .......................... | 257/666 |
| 5,556,807 | 9/1996 | Bhattacharyya et al. ................. | 298/27 |
| 5,576,577 | 11/1996 | Takenouchi et al. ..................... | 257/672 |
| 5,629,559 | 5/1997 | Miyahara ................................. | 257/666 |
| 5,905,634 | 5/1999 | Takeda et al. ............................ | 257/66 |

Primary Examiner—Alexander O. Williams
Attorney, Agent, or Firm—Fleshner & Kim, LLP

[57] ABSTRACT

A lead frame structure and semiconductor package using the same and fabrication method thereof is provided that decreases noise by providing prescribed impedances for leads of a lead frame. The lead frame structure for the semiconductor package includes a paddle, a plurality of leads regularly aligned outside the paddle, and upper and lower dielectric adhesive layers sandwiching the plurality of leads. Upper and lower dielectric layers are attached on an upper surface of the upper dielectric adhesive layer and a lower surface of the lower dielectric adhesive layer. Upper and lower metallic polar plates formed on an upper surface of the upper dielectric layer and a lower surface of the lower dielectric layer. The lead frame structure for the semiconductor package decreases noises such as electromagnetic noise, reflection noise and delta-I noise by appropriately providing characteristic impedances for selected leads applicable to signal lines and at the same time decreasing characteristic impedances for the selected leads applicable to power lines or ground lines.

26 Claims, 6 Drawing Sheets

MULTILAYER LEAD FRAME STRUCTURE THAT REDUCES CROSS-TALK AND SEMICONDUCTOR PACKAGE USING SAME AND FABRICATION METHOD THEREOF

BACKGROUND OF THE INVENTION

1. Field of the Invention

The present invention relates to a semiconductor package and fabrication method thereof, and in particular, to a lead frame structure and semiconductor package using the same and fabrication method thereof for a semiconductor package.

2. Background of the Related Art

In general, a semiconductor packaging protects a semiconductor chip. With advanced process techniques, semiconductor chips have gradually decreased in size. Accordingly, faster computer systems require a highly integrated semiconductor. To provide optimal operating conditions of such a system, an internal noise of the system should be decreased or minimized.

With regard to such internal noise, an electro-magnetic cross-talk noise that is known to be disadvantageous only in a board level of the system also critically effects at a semiconductor chip level. Namely, an integrated semiconductor package serves to increase a clock frequency. As a wavelength of a signal becomes closer to a wirelength, an interconnection line comes to operate like an antenna that increases a radiation noise. Also, there is an increased coupling such as a capacitive, an inductive, and a resistive coupling between interconnection lines because a wire interval becomes relatively narrowed with high integration. Thus, an electromagnetic cross-talk noise is increased and accordingly the system capability is deteriorated.

Another factor that lowers the system function is attributed to a simultaneous switching noise that is referred to as delta-I noise or di/dt noise (hereinafter "delta-I noise"). The delta-I noise results from a power line in the internal system or from a ground line. An electromotive force (E) that occurs in an inductor is obtained by an inductance (L) times a current variation amount per hour (di/dt) or by E=L(di/dt). A current outputted from a power source suffers a voltage drop due to a reverse electromotive force induced while passing through the inductor of the power line. Thus, a supply voltage provided to a required circuit becomes much lower than the initial voltage, which frequently causes an erroneous operation. Further, as chip integration increases, and more input/output ports are required, an entire capacitive load also becomes greater. For faster circuit operation, the capacitive load should be charged or discharged in a faster manner so that an average current and the current variation amount per hour (di/dt) can increase. However, the increased average current and the current variation amount per hour (di/dt) causes further delta-I noise.

Figure 1:
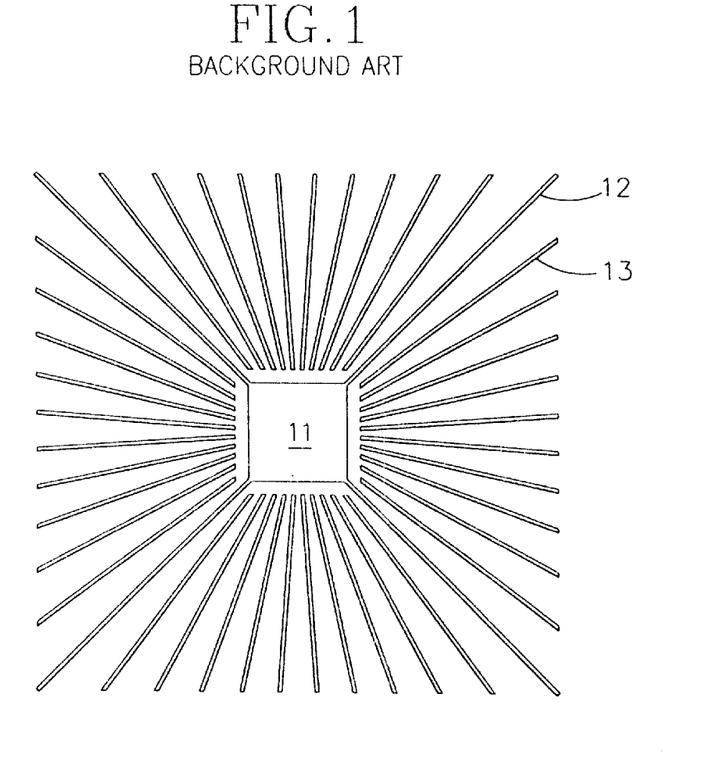
FIG. 1 is a diagram illustrating a plan view of a related art lead frame for a Quad Flat Package (QFP)

FIG. 1 illustrates a plan view of a related art lead frame structure for a Quad Flat Package (QFP). The frame structure includes a paddle 11 for attaching a chip thereon, a tie bar 12 extended outwardly from each corner of the paddle 11 and supporting the paddle 11 and a plurality of leads 13 aligned proportionally around the paddle 11. The leads 13 are composed of signal leads, power leads and ground leads, depending on their functions.

Although the above-mentioned disadvantages have to do with interconnection lines within a system circuit, a lead frame equipped inside a semiconductor package may be an additional, more serious problem. Respective leads of the lead frame are longer than the connection lines, and the inductance and capacitance of the leads become larger than those of the interconnection lines. Therefore, a packaging structure is needed that may decrease or minimize such problems as electromagnetic cross-talk noise and delta-I noise.

SUMMARY OF THE INVENTION

An object of the present invention is to substantially obviate at least the disadvantages and problems in the related art.

Another object of the present invention to decrease noise including electromagnetic noise, reflection noise and delta-I noise.

A further object of the present invention to control characteristics impedances for one of selected leads applicable to signal lines and selected leads applicable to power lines or ground lines.

To achieve at least the above-described objects in whole or in parts, a lead frame structure according to the present invention includes a paddle, and a plurality of leads regularly aligned outside the paddle, upper and lower dielectric adhesive layers enclosing the plurality of leads, upper and lower dielectric layers respectively attached on an upper surface of the upper dielectric adhesive layer and a lower surface of the lower dielectric adhesive layer, and upper and lower metallic polar plates respectively formed on an upper surface of the upper dielectric layer and a lower surface of the lower dielectric layer.

To further achieve the above-described objects in a whole or in parts, a semiconductor package according to the present invention includes a paddle, a plurality of inner leads regularly aligned outside the paddle, upper and lower dielectric adhesive layers respectively sandwiching the plurality of inner leads therebetween, an upper and lower dielectric layers respectively attached on an upper surface of the upper dielectric adhesive layer and a lower surface of the lower dielectric adhesive layer, upper and lower metallic polar plates respectively formed on an upper surface of the upper dielectric layer and a lower surface of the lower dielectric layer, a semiconductor chip mounted on an upper surface of the paddle, a plurality of first conductive wires electrically coupling the semiconductor chip and the plurality of inner leads, a plurality of second conductive wires electrically coupling the plurality of inner leads and the upper and lower conductive metallic layers, a molding compound sealing a predetermined area of the semiconductor package including the semiconductor chip, the first and second conductive wires, the inner leads, and the upper and lower metallic polar plates, and a plurality of outer leads extending from corresponding ones of the inner leads toward an outside of the molding compound.

Still further, to achieve the above-described objects in a whole or in parts, a semiconductor package fabrication method according to the present invention includes forming a upper and lower metallic polar plates, enclosing a plurality of inner leads in a lead frame between the metallic polar plates using a dielectric adhesive layer, mounting a semiconductor chip on a paddle of the lead frame, electrically coupling the semiconductor chip to each of the upper and lower metallic polar plates and to the inner leads, sealingly molding the semiconductor chip, the inner leads and the metallic polar plates, and trimming and forming outer leads from outer portions of the inner leads so that unnecessary portions of the lead frame are removed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

A semiconductor package according to embodiments of the present invention increases capacitances of leads when a constant voltage in conductive layers is maintained. In particular, as distances between the conductive layers and the leads is reduced, the more the capacitances are increased.

Figure 2:
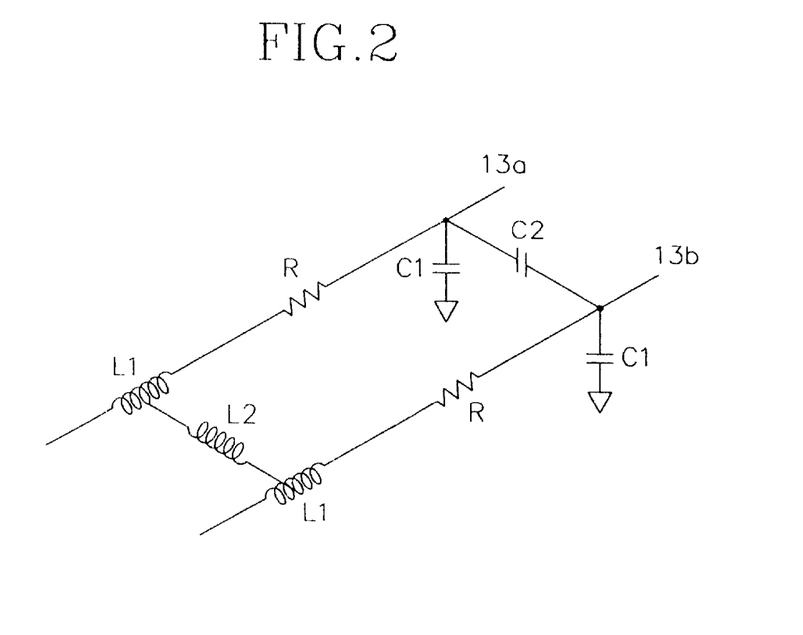
FIG. 2 is a circuit diagram illustrating a circuit formed between leads in the lead frame structure of FIG. 1.

FIG. 2 illustrates an equivalent electrical circuit formed by respective leads in the related art lead frame structure in FIG. 1. The equivalent circuit includes a random lead 13a and a lead 13b adjacent to the random lead 13a. FIG. 2 further illustrates a resistance R of respective leads, an inductance L1 of respective leads, a ground capacity C1 of respective leads, an interinductance L2 between respective leads, and an intercapacitor C2 between respective leads.

When signals are switched in the lead frame structure of FIG. 1, a sudden current flows through power leads or ground leads of the leads 13 so a voltage drop occurs due to the inductance that exists in the leads 13. Such a voltage drop can be referred to as Delta-I noise. The magnitude of Delta-I can be expressed as formula (1):

$$\Delta V = NL_{eff}(di/dt) \qquad (1).$$

In formula (1), N denotes number of driver circuits that simultaneously switch, $L_{eff}$ is an effective inductance with regard to power leads or ground leads, di/dt is a current variation amount per hour flowing through the power leads or the ground leads.

As indicated in formula (1), Delta-I noise may be reduced by decreasing a number of the driver circuits that simultaneously switch (e.g., N), a variation of the current that flows through the respective power leads or the ground leads (e.g., di/dt), or an inductance of the respective power leads or the ground leads (e.g., $L_{eff}$) However, if the current variation that flows through the power leads and the ground leads with regard to a given voltage is reduced, a switching speed becomes slower. Further, decreasing a number of the driver circuits that simultaneously switch deceases an amount of data that can be simultaneously processed.

Referring to FIG. 2, a characteristic impedance of the leads in the lead frame can be obtained by square-rooting a ratio of inductance L1 in the lead 13 and capacitance C between each lead 13 and the ground lead having an alternating current ($\sqrt{L/C}$). When a relative permitivity of the entire dielectric is "1", a value of capacitance times inductance remains constant. Therefore, to reduce a valid inductance of the power lead or the ground lead, the characteristic impedance of the respective leads should be decreased. That is, an inductance of the leads 13 may be decreased by increasing a lead capacitance when the relative permitivity is "1".

However, respective leads of a lead frame are composed of signal leads, ground leads and power leads. When characteristic impedances of the signal leads are decreased, a signal current should be increased to maintain switching in an allowed time. Therefore, an increased variation (di/dt) with regard to a time interval for current flow in the power leads or ground leads serves to increase a delta-I noise. Also, compared to respective capacitances of the leads, coupling capacitances between adjacent leads can be decreased to decrease an electromagnetic cross-talk. Thus, there is preferably an appropriate range (about 40 Ω~75 Ω) of characteristic impedances for signal leads that reduces or minimizes a cumulative amount of delta-I noise and electromagnetic cross-talk.

Therefore, a distance between the leads and the conductive layers is preferably determined to minimize a total amount of delta-I noise and electromagnetic cross-talk. The distance may be controlled, for example, by adjusting the thickness of the dielectric layers.

Also, to decrease the delta-I noise, a total inductance should be reduced in paths for power supply as well as decreasing the inductances of the leads. The power supply paths include the supply leads of the lead frame, bonding wire that electrically couples the supply leads with the semiconductor chip, and another bonding wire that electrically couples the supply leads with the upper and lower conductive layers. According to the present invention, it becomes important to decrease the inductance in the bonding wires. To decrease the inductance in the bonding wires, its length should be decreased by preferably coupling a plurality of bonding wires in parallel with each other. In the preferred embodiments of the present invention, the bonding wire or the like applicable to power supply is employed by coupling the plurality of bonding wires in parallel with each other.

Also, a number of leads for power supply may be increased to decrease the inductance in the power supply. As the number of power leads or ground leads increases, the inductance in the power supply paths is further decreased. However, the increased number of power or ground leads cause the number of leads used as signal lines to relatively decrease. Thus, the number of power supply leads is preferably limited to less than 33% of all leads.

Figure 3:
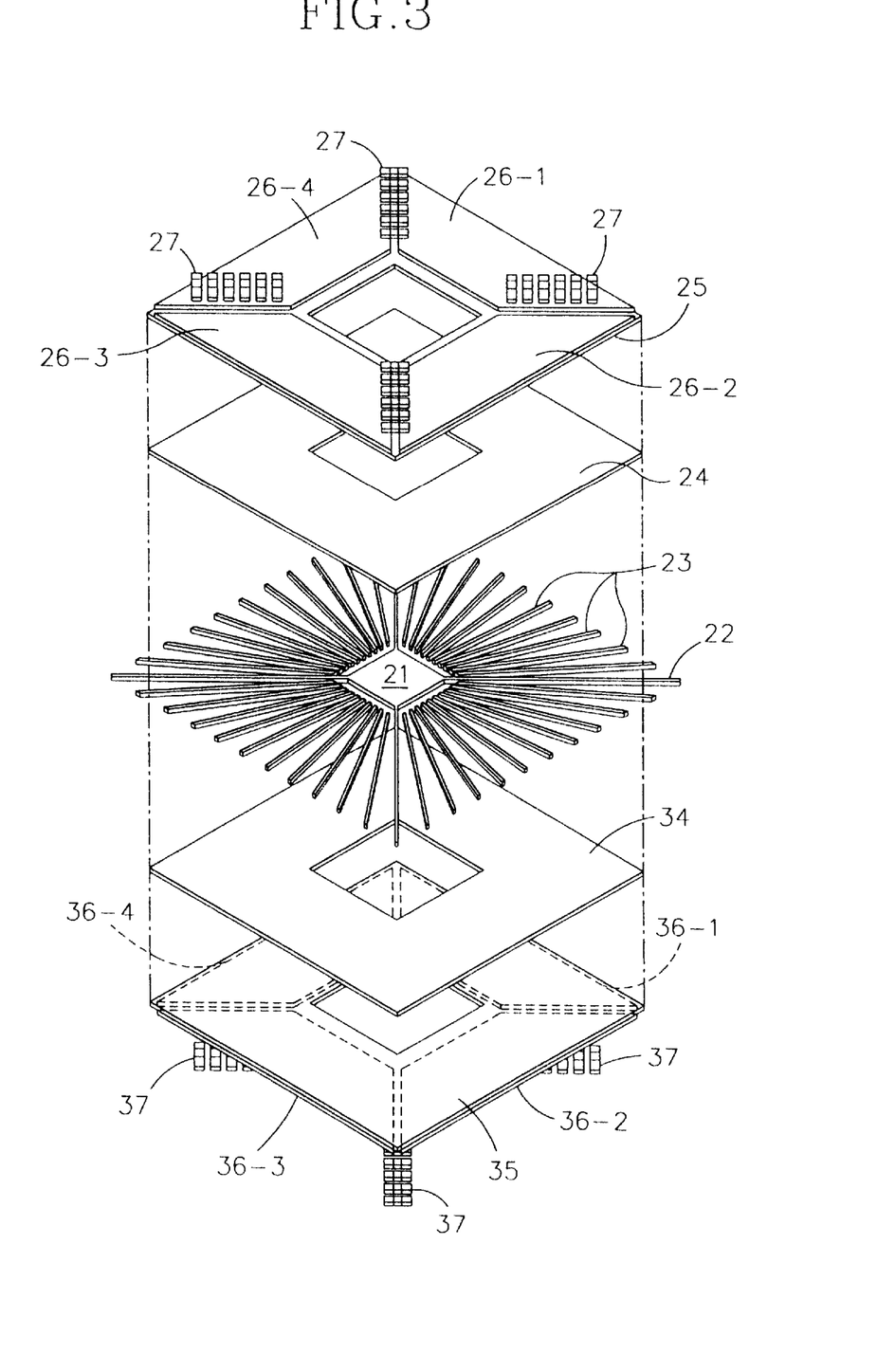
FIG. 3 is an exploded perspective diagram illustrating a preferred embodiment lead frame structure according to the present invention.
Figure 4A:
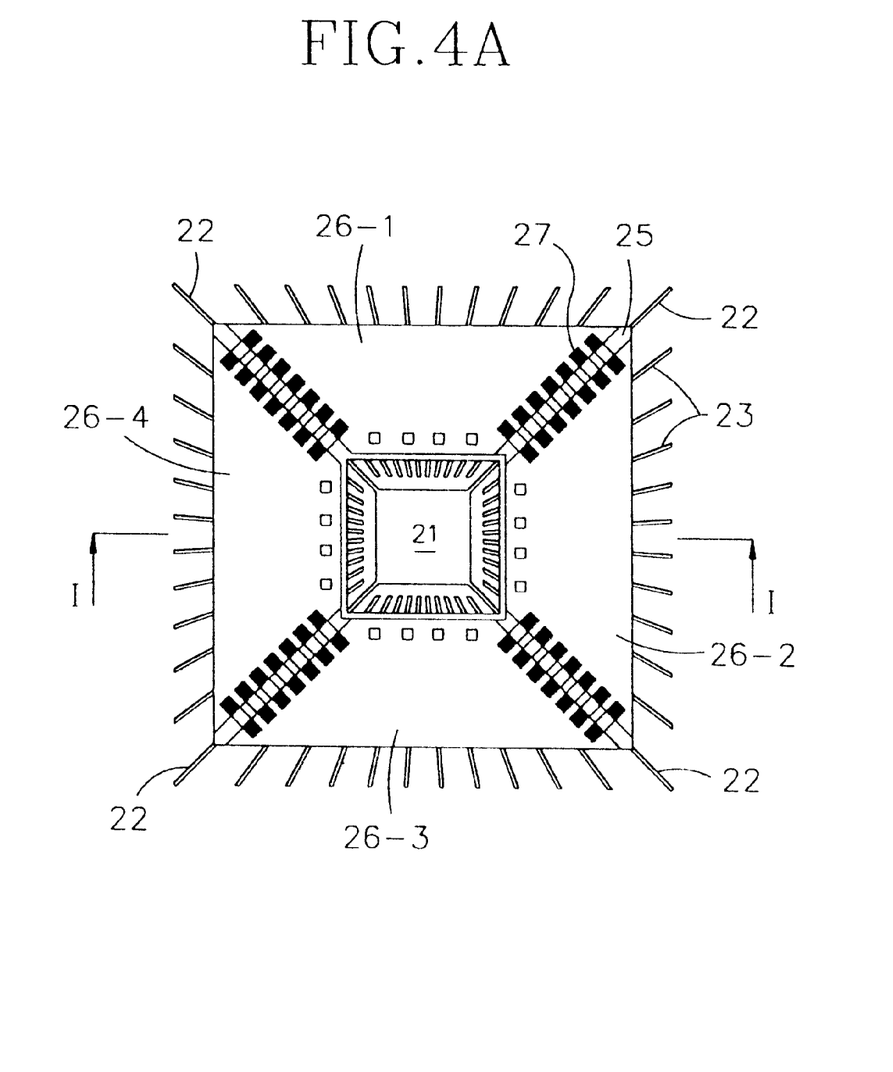
FIG. 4A is a diagram illustrating a plan view of the lead frame structure of FIG. 3.
Figure 4B:
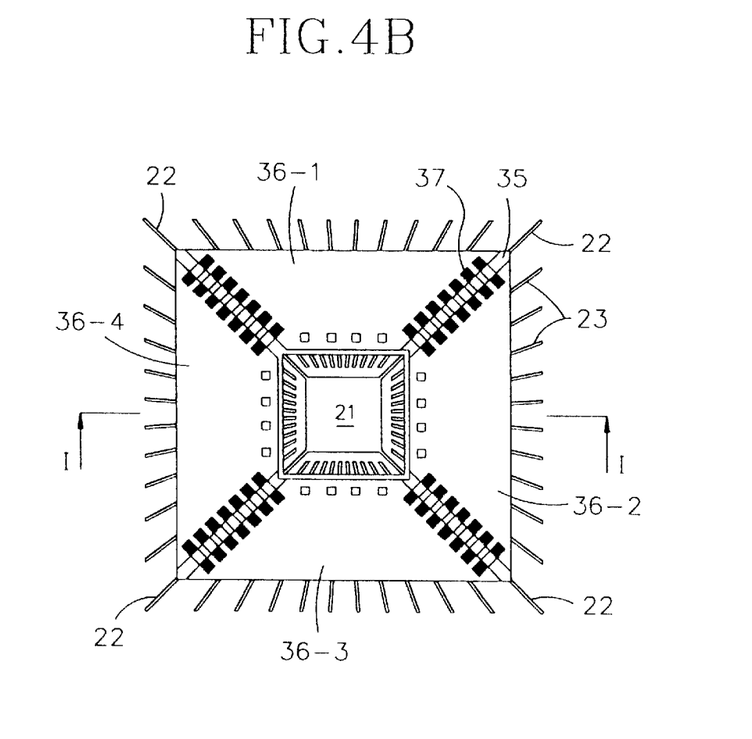
FIG. 4B is a diagram illustrating a bottom view of the lead frame structure of FIG. 3.
Figure 4C:
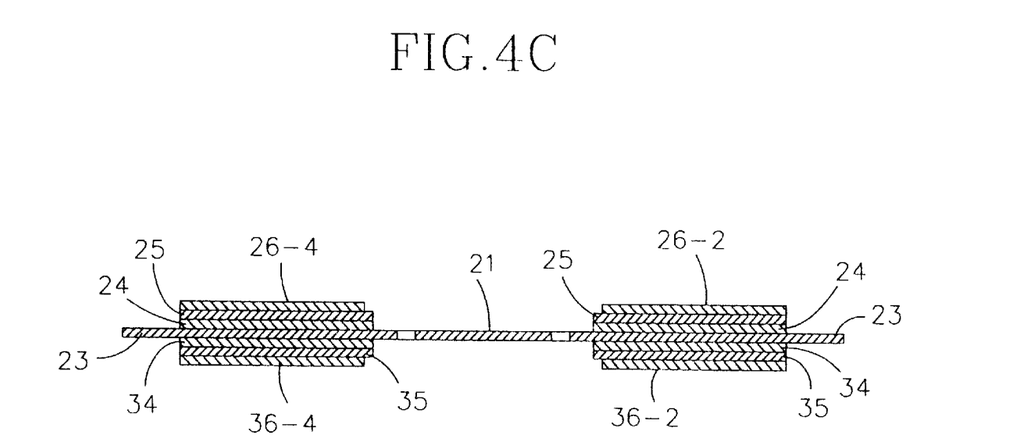
FIG. 4C is a diagram illustrating a cross-sectional view taken along line I—I in FIG. 4A.

FIG. 3 is a diagram showing an exploded perspective view of a lead frame structure according to a first preferred embodiment of the present invention. FIGS. 4A and 4B are diagrams showing a plan view and a bottom view, respectively, of the lead frame structure, and FIG. 4C is a diagram showing a cross-sectional view taken along line I—I in FIG. 4A. As shown in FIGS. 3–4C, the first preferred embodiment of a lead frame includes a square paddle 21, a tie bar 22 extended from each corner of the paddle 21 and supporting the paddle 21, and a plurality of leads 23 divided into inner leads and outer leads.

The lead frame is disposed between a pair of dielectric adhesive layers 24, 34, on each surface of which is disposed an upper dielectric layer 25 and a lower dielectric layer 35. The dielectric adhesive layers are formed of dielectric material. Four metallic polar plates 26-1, 26-2, 26-3, 26-4 are attached onto the upper surface of the upper dielectric layer 25, and four other metallic polar plates 36-1, 36-2, 36-3, 36-4 are attached onto the bottom surface of the lower dielectric layer 35. Each of the four metallic polar plates 26-1, 26-2, 26-3, 26-4 are preferably vertically aligned with the four other metallic polar plates 36-1, 36-2, 36-3, 36-4. A plurality of chip capacitors 27, 37 are attached between the metallic polar plates 26, 36, respectively.

The dielectric adhesive layers 24, 34 are formed of adhesive dielectric materials. When a predetermined voltage is applied to the upper and lower metallic polar plates 26-1, 26-2, 26-3, 26-4, 36-1, 36-2, 36-3, 36-4, the upper dielectric layer 25 and the lower dielectric layer 35 increase respective capacitances between a corresponding pair of the respective polar plates 26-1, 26-2, 26-3, 26-4, between a corresponding pair of the respective polar plates 36-1, 36-2, 36-3, 36-4, and between the respective metallic polar plates 26-1, . . . , 36-4 and the leads 23. The capacitance value may be obtained by adjusting distances between the respective metallic polar plates 26-1, . . . , 36-4 and the leads 23, and by adjusting respective thicknesses of the dielectric layers 24, 34, 25, 35. The respective thicknesses of the dielectric layers 24, 34, 25, 35 should be such that the characteristic impedance of the leads 23 appropriately reduces or minimizes a summed-up value of delta noise and electromagnetic cross-talk noise. An appropriate characteristic impedance preferably ranges from about 40 Ω to 75 Ω. Also, due to the chip capacitors 27, 37, the capacitances for the power leads and ground leads is increased.

Further, in the lead frame structure according to the first preferred embodiment of the present invention, the upper metallic polar plate 26 and the lower metallic polar plate 36 should be coupled to power leads and ground leads during packaging (e.g., wirebonding) to regularly provide a supply voltage and a ground voltage, respectively, for increasing or maximizing the capacitance. Therefore, when the supply voltage (or the ground voltage) is applied to a randomly selected metallic polar plate, the ground voltage (or the supply voltage) is applied to a metallic substrate disposed at a corresponding location to a downward (or upward) direction of the selected metallic polar plate together with the metallic polar plates adjacent to each side of the selected metallic polar plate.

That is, as shown in FIGS. 4A through 4C, if the supply voltage is applied to the metallic polar plates 26-2, 26-4, 36-1, 36-3, the ground voltage is preferably applied to the metallic polar plates 26-1, 26-3, 36-2, 36-4. Thus, metallic polar plates adjacent to each other have polarities different from each other with regard to the applied voltage. Accordingly, a capacitance is increased between power leads and ground leads by attaching the chip capacitors 27, 37 between the metallic polar plates. The electrical paths for the supply voltage and the ground voltage are preferably formed on the respective metallic plates 26-1, . . . , 36-4 by electrically coupling the voltage-applied leads and the respective metallic plates via conductive wires or the like.

Figure 5A:
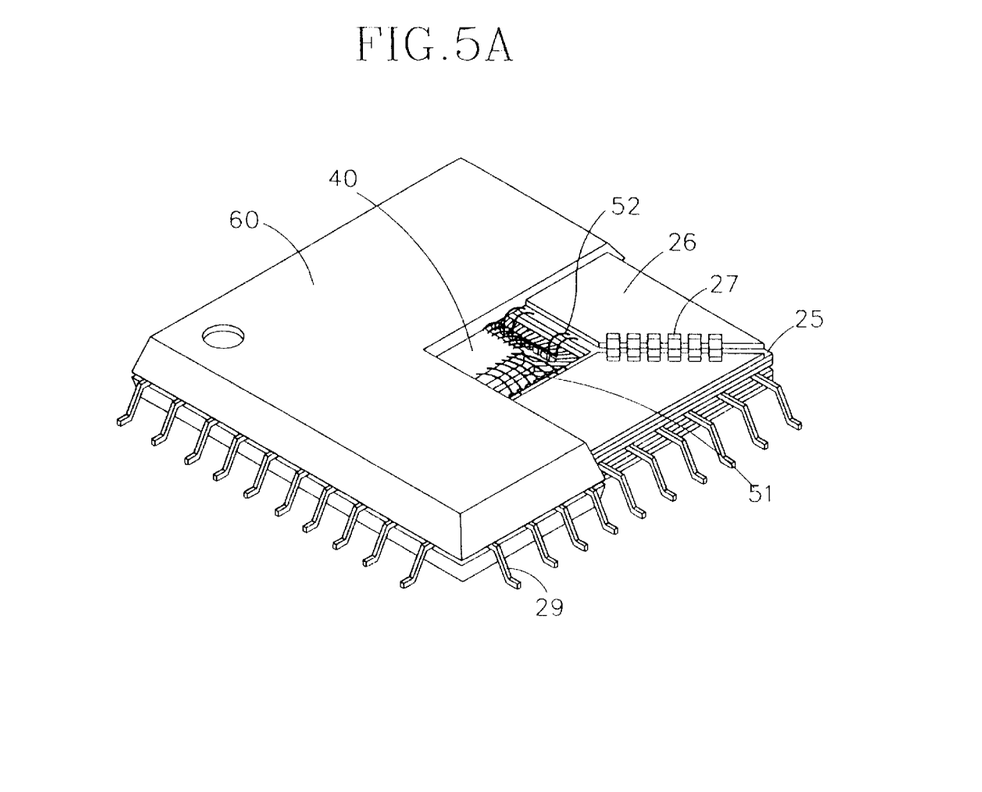
FIG. 5A is a diagram illustrating partially sectioned perspective view of a preferred embodiment of a semiconductor package employing a lead frame structure according to the present invention.
Figure 5B:
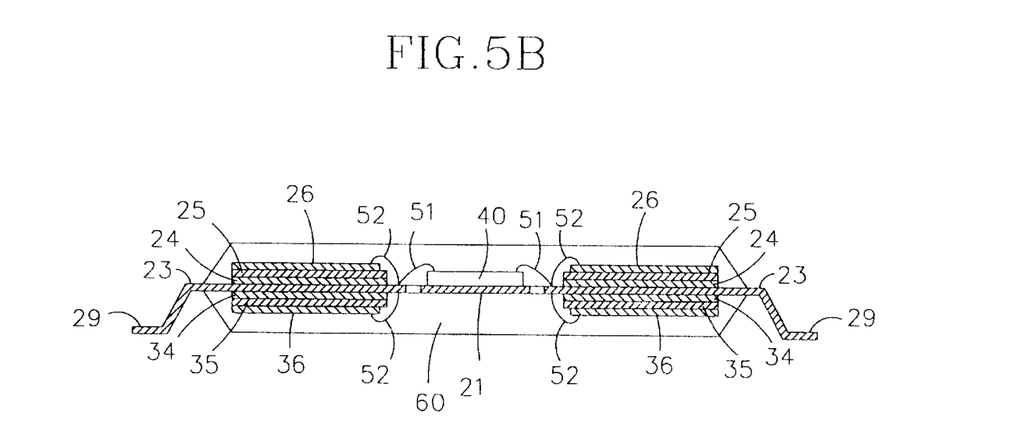
FIG. 5B is a diagram illustrating a cross-sectional view of the semiconductor package of FIG. 5B.

FIGS. 5A and 5B are diagrams illustrating a partially cross-sectioned perspective view and a cross-sectional view of a QFP type semiconductor package using a lead frame structure according to a second preferred embodiment of the present invention. The package includes the paddle 21, the plurality of inner leads 23 regularly aligned off from the paddle 21, and the upper dielectric adhesive layer 24 and the lower dielectric adhesive layer 34 that sandwich the inner leads 23 with the exception of respective end portions of the leads 23. The upper dielectric layer 25 and the lower dielectric layer 35 are respectively attached on the upper surface of the upper dielectric adhesive layer 24 and on the bottom surface of the lower dielectric adhesive layer 34. The four-partitioned upper metallic polar plate 26 is formed on the upper surface of the upper dielectric layer 25. The four-partitioned lower metallic polar plate 36 is formed on the bottom surface of the lower dielectric layer 35. The plurality of chip capacitors 27, 37 couple a corresponding pair of the partitions of the metallic polar plates 26, 36. A semiconductor chip 40 is mounted on the paddle 21. A plurality of conductive wires 51, 52 electrically couple the semiconductor chip 40 and the inner leads 23, and also electrically couple the inner leads and the upper and lower metallic polar plates 26, 36. A molding compound 60 seals a predetermined area including the semiconductor chip 40, the conductive wires 51, 52 and the inner leads 23. In addition, a plurality of outer leads 29 extend from the respective inner leads 23 outside the molding compound 60.

As shown in FIGS. 5A and 5B, the upper metallic polar plate 26 and the lower metallic polar plate 36 are electrically coupled by the conductive wires 52 to the inner leads 23. Thus, the metallic polar plates 26, 36 receive the supply voltage and the ground voltage so that the packaging (e.g., wire bonding) is preferably performed with the supply voltage and ground voltage applied to the respective metallic polar plates 26, 36. That is, when the supply voltage (or the ground voltage) is applied to a selected metallic polar plate, the ground voltage (or the supply voltage) is applied to an upper (or lower) metallic substrate disposed corresponding the selected metallic polar plate together with the other metallic polar plate adjacent to each side of the selected metallic polar plates. For further description with reference to FIGS. 5A and 5B, if the supply voltage is applied to the metallic polar plate 26, then the ground voltage is applied to the metallic polar plate 36. Further, the adjacent pairs of the metallic polar plates on the same layer level are different from each other in polarity, and the capacitance values between power leads and ground leads is increased by attaching the chip capacitors 27, 37 between respective adjacent metallic polar plates.

Figure 6:
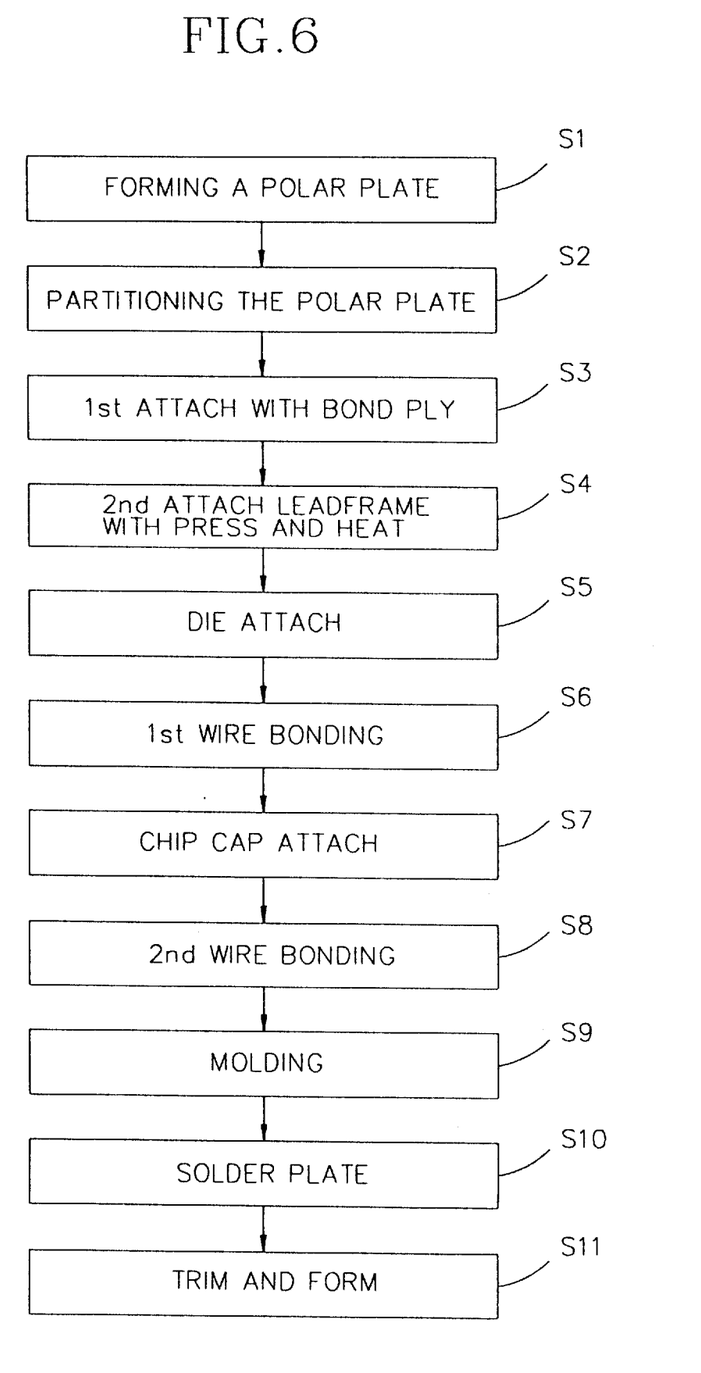
FIG. 6 is a flow chart illustrating a preferred embodiment of a fabrication method of a semiconductor package according to the present invention.

As shown in FIG. 6, a third preferred embodiment of a fabrication method of the semiconductor package according to the present invention will now be described. Initially, the process begins in step S1 where a metallic polar plate is fabricated. The metallic polar plate is to reinforce a capacitance of a lead frame structure. To form such a metallic polar plate, there is employed a film type material with a copper layer formed on a dielectric layer such as a kapton (hereinafter, "copper-clad metal"). The copper-clad metallic material is used to realize an electrical characteristic required by use of a semiconductor processing. The present invention is not intended to be so limited. Alternative materials that result in the desired electrical characteristics can also be used.

However, a copper-clad metallic material was selected in consideration of productivity. The copper-clad metallic material realizes a variety of thicknesses thereof and a dielectric constant, and a capacitance obtained in accordance with the preferred embodiments. Also, the copper-clad metallic material is applicable to a flexible PCB process, which facilitates a material purchase and a package fabrication. From step S1, control continues to step S2.

In step S2, a copper layer is selectively etched from the copper-clad metal formed of the dielectric layer and a copper layer to form a four-partitioned copper polar plate, that is, to form a lamination of copper-clad on the dielectric layer. A preferred structure of the metallic polar plate formed of the copper-clad material used according to third preferred embodiment is composed of the upper and lower metallic polar plates 26, 36, which are respectively four-partitioned. When the polar plates 26, 36 sandwich on the inner leads of the lead frame, opposite polarities of voltage are applied between adjacent pairs of the partitioned plates. To satisfy the above-mentioned requirements, a general flexible PCB process is employed to etch the copper layer from the copper-clad metal to form a four-partitioned metallic polar plate on the kapton film. At this time, in the inner leads of the lead frame, an area occupied by the metallic polar plate is increased or preferably maximized within its allowed range to improve an electrical characteristic.

For example, as shown in FIGS. 4A–4C, the metallic polar plates 26, 36 attached on the inner leads 23 are extended within the area except for at least respective end portions of the inner leads 23. That is, the size of the metallic polar plates should not interrupt with wire bonding used to electrically couple the semiconductor chip and the inner leads. Also, the size of the plates should not affect a molding process preformed to protect semiconductor devices. From step S2, control continues to step S3.

In step S3, the metallic polar plate formed in the second process is formed into a state in which a temporary attachment is performed to attach the polar plate on the upper surface of the inner leads. Because an adhesive component does not exist in the metallic polar plate formed of a copper-clad metal formed in step S2 and in the dielectric layer formed on a lower surface of the metallic polar plate, the third process is preferably carried out prior to adding a dielectric adhesive film between the dielectric layer and the inner leads of the lead frame. The dielectric layer having the metallic polar layer formed thereon is not attached on the inner leads, so that an adhesive film is attached on the bottom surface of the dielectric layer. This is a process in which the metallic polar plate is temporarily attached on certain portions of the inner leads. Also, by use of an static electricity in the dielectric layer and dielectric adhesive film, the electrical parameter for the preferred embodiments of the present invention may be obtained. That is, by controlling the static electricity, by controlling the thickness of the dielectric layer and the dielectric adhesive film and by adjusting the distances between the metallic polar plates, a characteristic electrical impedance is obtained. From step S3, control continues to step S4.

In step S4, the temporarily attached metallic polar plates are respectively attached on the upper and lower surface of the inner leads of the lead frame. In the fourth step, the temporarily attached metallic polar plates from step S3 are attached on the upper and lower surfaces of the inner leads using a known flexible PCB processing line. In addition, a flatness of the lead frame is realized by the following steps. Also, using such a dielectric adhesive film as a medium, the upper and lower metallic polar plates are attached by heat and pressure onto the inner leads. The upper and lower metallic polar plates are attached onto each side of the inner leads to increase respective capacitances and decrease respective inductances of the leads. The upper and lower metallic polar plates form capacitors using a method in which a pair of voltages opposite from each other are appropriately applied to the upper and lower metallic polar plates as described below. Thus, in step S4, the four-partitioned metallic polar plate are respectively attached on the upper and lower surface of the inner leads by using the dielectric layer and the dielectric adhesive film as medium. From step S4, control continues to step S5.

In step S5, a semiconductor chip is mounted on the paddle of the lead frame for a die attach. To improve an adhesive property, an epoxy resin is preferably employed in the attachment. From step S5, control continues to step S6.

In step S6, a first wire bonding is carried out to electrically couple the semiconductor chip mounted on the paddle in step S5 to the respective inner leads of the lead frame. Using a conductive wire as a medium, the electrical coupling is carried out between the chip and the inner leads. Also, the upper metallic polar plate and the inner leads are electrically coupled to each other to induce supply and ground voltages. At this time, the supply voltage and the ground voltage should be regularly applied to the upper four partitioned metal polar plates, and the polarities of voltage applied to each adjacent pair of the partitioned pieces of the metallic polar plate should be opposite to each other. From step S6, control continues to step S7.

In step S7, a plurality of chip type capacitors are bridged between each adjacent pair of the partitioned pieces of the metallic polar plate to attach the chip capacitors. The chip capacitors also restrain a ground bouncing of the upper and lower four-partitioned metallic polar plates that sandwich the inner leads. From step S7, control continues to step S8.

In step S8, a wire bonding copper-clad processing is preferably performed as a second wire bonding. The second wire bonding in step S8 can be followed by the first wire bonding step performed in step S6. In step S8, the upper and lower metallic polar plates are electrically coupled to the inner leads for power and ground by preferably using a conductive wire as the medium. As in step S6, the supply voltage and the ground voltage should be regularly applied to the lower metallic polar plate. At this time, the polarities of voltage applied to each adjacent pair of the partitioned pieces of the metallic polar plate should be opposite to each other, and the polarities of applied voltage of each of the partitioned pieces of the lower metallic polar plate should be different from a vertically corresponding one of the partitioned pieces of the upper metallic polar plate.

In step S6 and step S8, the supply voltage and ground voltage, which are opposite in polarity, are preferably applied to the upper and lower metallic polar plates to form capacitors that bridge each adjacent pair of the partitioned pieces of the upper and lower metallic polar plates. Also, by attaching such chip capacitors between the adjacent pairs in the metallic polar plates, the capacitances between power leads and ground leads are increased and the variation of the voltage being applied to the semiconductor chip is reduced or minimized. From step S8, control continues to step S9.

In step S9, a molding processing is carried out to package or seal a predetermined area of the lead frame including the semiconductor chip, wires, inner leads and metallic polar plates by using a material such as ceramic, plastic and epoxy resin. From step S9, control continues to step S10.

In step S10, a solder plating process is carried out to facilitate the soldering the outer leads and a substrate and prevent a copper erosion. The lead frame is preferably formed of copper. From step S10, control continues to step S11.

In step S11, a trimming and forming is carried out to sever unnecessary portions from the outer leads of the lead frame to obtain respective signal lines and to produce a semiconductor package after molding. From step S11, the process ends.

As described above, the preferred embodiments of the present invention have various advantages. The preferred embodiments include an inner lead structure sandwiched by the upper and lower metallic polar plates using a dielectric material as medium to select characteristic impedances for the leads applicable to signal lines. Further, the characteristic impedances for the selected leads applicable to power lines or ground lines are decreased. Thus, noise such as electromagnetic noise, reflection noise and delta-I noise may be significantly decreased in the semiconductor package.

The foregoing embodiments are merely exemplary and are not to be construed as limiting the present invention. The present teaching can be readily applied to other types of packages. For example, the teachings of the preferred embodiment can be applied to bottom lead packages (BLP). The description of the present invention is intended to be illustrative, and not to limit the scope of the claims. Many alternatives, modifications, and variations will be apparent to those skilled in the art.

What is claimed is:

1. A lead frame, comprising:

a plurality of leads;

upper and lower dielectric adhesive layers with said plurality of leads therebetween;

upper and lower dielectric layers respectively attached to an upper surface of said upper dielectric adhesive layer and a lower surface of said lower dielectric adhesive layer; and upper and lower conductive plates respectively coupled to an upper surface of said upper dielectric layer and a lower surface of said lower dielectric layer, wherein said plurality of leads is positioned between the upper and lower conductive plates.

2. The lead frame of claim 1, wherein said upper and lower dielectric adhesive layers are formed on said leads with except for inner and outer end portions of said leads.

3. The lead frame of claim 1, wherein each of said upper and lower conductive plates are partitioned into a plurality of pieces.

4. The lead frame of claim 1, further comprising a paddle that is coupled to a plurality of tie bars, wherein said upper and lower conductive plates are respectively partitioned into four pieces.

5. The lead frame of claim 1, wherein said upper and lower dielectric layers are formed of kapton, and wherein said upper and lower conductive plates are metallic polar plates formed on the dielectric layers of copper.

6. The lead frame of claim 3, wherein at least one chip capacitor is bridged between an adjacent pair of the plurality of partitioned pieces in each of said upper and lower conductive plates.

7. The lead frame of claim 3, wherein each of the plurality of partitioned pieces in said upper conductive plates has a prescribed polarity and is arranged over only a single corresponding one of the plurality of partitioned pieces in said lower conductive plates that has an opposite polarity.

8. The lead frame of claim 1, wherein said upper and lower conductive plates are coupled to said leads having opposite polarities with each other.

9. A semiconductor package, comprising:

a semiconductor chip;

a plurality of inner leads;

a plurality of first conductive wires coupling said semiconductor chip and said plurality of inner leads;

upper and lower dielectric adhesive layers sandwiching said plurality of inner leads;

upper and lower dielectric layers attached on an upper surface of said upper dielectric adhesive layer and a lower surface of said lower dielectric adhesive layer, respectively;

upper and lower metallic polar plates respectively coupled to an upper surface of said upper dielectric layer and a lower surface of said lower dielectric layer, wherein each of said upper and lower metallic polar plates is respectively partitioned into a plurality of pieces, an adjacent pair of partitioned pieces is composed of a corresponding partitioned piece in said each of the upper and lower metallic polar plates, and each of the adjacent pair of partitioned pieces are respectively coupled to corresponding ones of said inner leads having opposite polarities such that said each of the adjacent pair of partitioned pieces has an opposite polarity; and a plurality of second conductive wires respectively coupling said plurality of inner leads and said upper and lower conductive metallic layers.

10. The lead frame structure of claim 9, further comprising:

a paddle coupled to a plurality of tie bars, wherein the semiconductor chip is mounted on an upper surface of said paddle;

a molding compound packaging a prescribed area of said semiconductor package including said semiconductor chip, said first and second conductive wires, said inner leads, and said upper and lower metallic polar plates; and a plurality of outer leads extending from corresponding ones of said inner leads outside said molding compound.

11. The lead frame structure of claim 9, wherein said upper and lower dielectric adhesive layers are formed on said inner leads excepting at least a side pair of outer end portions of said inner leads.

12. The lead frame structure of claim 9, wherein a plurality of chip capacitors are bridged between a horizontal adjacent pair of the partitioned pieces in each of said upper and lower metallic polar plates.

13. The lead frame structure of claim 9, wherein said upper and lower metallic polar plates are respectively partitioned into an even number of pieces.

14. The lead frame structure of claim 9, wherein said upper and lower dielectric layers are formed of kapton, and wherein said upper and lower metallic polar plates are formed of copper.

15. The lead frame structure of claim 9, wherein said inner leads coupled to said upper and lower metallic polar plates apply one of a first voltage and a second voltage.

16. The lead frame structure of claim 9, wherein each of said upper and lower dielectric layers has a prescribed thickness so that characteristic impedances of said inner leads range from 40 Ω to 75 Ω.

17. The semiconductor package of claim 9, wherein said leads are positioned between the upper and lower metallic polar plates.

18. A chip package, comprising:

a chip having a plurality of bond pads;

a plurality of leads coupled to said plurality of bond pads, each lead having first and second surfaces, wherein the first and second surfaces are a top surface and a bottom surface, respectively;

a first capacitor formed on the top surface, having,
  a first dielectric formed over the top surface of said plurality of leads, and
  a first conductive plate formed over said first dielectric and partitioned into a plurality of first metallic plates;

a second capacitor formed on the bottom surface, having,
  a second dielectric formed on the bottom surface of said plurality of leads, and
  a second conductive plate formed on said second dielectric, wherein the second conductive plate is partitioned into a plurality of metallic plates;

a plurality of third capacitors coupling adjacent pairs of the plurality of second metallic plates; and a molding compound packaging said chip, said plurality of leads and said first capacitor.

19. The chip package of claim 18, wherein said molding compound encapsulates said chip, said plurality of leads and said first capacitor.

20. The chip package of claim 18, further comprising a paddle having a tie bar for supporting said paddle and said chip is mounted on said paddle.

21. The chip package of claim 18, wherein the first dielectric comprises:
  a dielectric adhesive layer; and
  a dielectric layer formed over said dielectric adhesive layer.

22. The chip package of claim 18, wherein said chip package further comprises a plurality of fourth capacitors coupling adjacent pairs of the plurality of first metallic plates.

23. The chip package of claim 22, wherein a first polar plate of the plurality of first metallic plates is aligned over a first polar plate of the plurality of second metallic plates, and wherein the first polar plate of the plurality of first metallic plates has an opposite polarity to the first polar plate of the plurality of second metallic plates.

24. The chip package of claim 18, wherein adjacent portions of said first and second metallic plates, respectively, are coupled to said leads having opposite polarities with each other.

25. The chip package of claim 18, wherein said leads are positioned between the first conductive plate and the second conductive plate.

26. The chip package of claim 18, wherein each of the plurality of pieces of the first conductive plate has a prescribe d polarity and is arranged over only a single corresponding one of the plurality of second metallic polar plates that has an opposite polarity.

* * * * *